(12) United States Patent
Huse et al.

(10) Patent No.: US 7,171,595 B1
(45) Date of Patent: Jan. 30, 2007

(54) CONTENT ADDRESSABLE MEMORY MATCH LINE DETECTION

(75) Inventors: Charles C. Huse, Mountain View, CA (US); Bindiganavale S. Nataraj, Cupertino, CA (US); Kumaresh Kavedi, Sunnyvale, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 364 days.

(21) Appl. No.: 10/156,532

(22) Filed: May 28, 2002

(51) Int. Cl.
*G11C 29/00* (2006.01)
(52) U.S. Cl. .................. 714/718; 711/108; 365/49

(58) Field of Classification Search ............... 714/718, 714/719, 723, 710, 711; 365/49, 200; 711/108
See application file for complete search history.

(56) References Cited

U.S. PATENT DOCUMENTS

| | | | |
|---|---|---|---|
| 4,928,260 A * | 5/1990 | Chuang et al. ............... 365/49 |
| 4,959,811 A | 9/1990 | Szczepanek | |
| 5,877,714 A * | 3/1999 | Satoh ......................... 341/87 |
| 6,199,140 B1 | 3/2001 | Srinivasan et al. | |

* cited by examiner

*Primary Examiner*—James C Kerveros
(74) *Attorney, Agent, or Firm*—Shemwell Mahamedi LLP

(57) ABSTRACT

According to one embodiment of the present invention, a content addressable memory (CAM) device includes a CAM array that includes a plurality of rows of CAM cells each coupled to a corresponding match line, and a test circuit coupled to the match lines that outputs row match results from the match lines onto a match output.

29 Claims, 11 Drawing Sheets

| | |
|---|---|
| INITIALIZE | 1101 |
| LOOP (TABLE DEPTH) | 1102 |
|     WRITE LOCAL MASK | 1103 |
|     WRITE MEMORY WITH DATA | 1104 |
| WRITE COMPARAND WITH SAME DATA | 1105 |
| COMPARE | 1106 |
| LOOP (TABLE DEPTH) | 1107 |
|     READ TEST CIRCUIT (EXPECT MATCH) | 1108 |
|     INCREMENT SCAN CHAIN | 1109 |

FIG. 11

| | |
|---|---|
| INITIALIZE | 1201 |
| LOOP (TABLE DEPTH) | 1202 |
|     WRITE LOCAL MASK | 1203 |
|     WRITE MEMORY WITH DATA | 1204 |
| WRITE COMPARAND WITH DIFFERENT DATA | 1205 |
| COMPARE | 1206 |
| LOOP (TABLE DEPTH) | 1207 |
|     READ TEST CIRCUIT (EXPECT MISMATCH) | 1208 |
|     INCREMENT SCAN CHAIN | 1209 |

FIG. 12

| | |
|---|---|
| INITIALIZE | 1301 |
| INVALIDATE ARRAY | 1302 |
| WRITE COMPARAND WITH DATA | 1303 |
| COMPARE | 1304 |
| LOOP (TABLE DEPTH) | 1305 |
|     READ TEST CIRCUIT (EXPECT MISMATCH) | 1306 |
|     INCREMENT SCAN CHAIN | 1307 |

CONTENT ADDRESSABLE MEMORY MATCH LINE DETECTION

FIELD OF THE INVENTION

The present invention relates generally to content addressable memory (CAM) devices. More specifically, the present invention relates to a method and apparatus for detecting match results on match lines in a CAM device.

BACKGROUND OF THE INVENTION

The architecture of traditional CAM devices typically includes a CAM array with a plurality of rows of CAM cells each coupled to a match line. A priority encoder and a flag logic are usually coupled to the CAM array via the match lines. In a compare operation, when comparand data matches data stored in a row of the CAM cells, the flag logic generates a match flag that qualifies the compare result. The priority encoder generates an index or address of the highest priority entry in the CAM array that matches the comparand data.

When the components in a CAM device are functioning properly, it may be possible to identify a match line that produces a certain match result after a compare operation from a generated match flag and index. However, in instances when there is a defect in the CAM array or a defect in a logic component coupled between the CAM array and the priority encoder, the architecture of current CAM devices makes identifying the match results on individual match lines more difficult. Having a reliable technique to determine the match results on individual match lines after a compare operation would allow for additional CAM device testing versatility. This would further assist in identifying defective rows for the purposes of row repair and identifying chronic manufacturing issues for the purposes of failure analysis.

BRIEF DESCRIPTION OF THE DRAWINGS

The features and advantages of the present invention are illustrated by way of example and are by no means intended to limit the scope of the present invention to particular embodiments shown, and in which:

FIG. 11 illustrates exemplary pseudo code for one embodiment of the method of FIG. 10;

FIG. 12 illustrates exemplary pseudo code for another embodiment of the method of FIG. 10; and FIG. 13 illustrates exemplary pseudo code for another embodiment of the method of FIG. 10.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses.

The present invention described herein concerns various embodiments of CAM devices that include additional circuit components such as test circuits that improve the ability of the CAM device to be tested by automated test equipment (ATE) such as logic testers or memory testers. The CAM devices described herein also may utilize the additional circuit components to provide built-in self-test (BIST) capabilities for the CAM devices. The improved CAM device architectures enable, for example, test sequences to be able to by-pass the flag logic and priority encoder to detect match results on individual match lines.

Embodiments of the present invention (e.g., exemplary processes described below with respect to FIGS. 10–13) may be provided as a computer program product, or software, that may include a machine-readable medium having stored thereon instructions. The machine-readable medium may be used to program a computer system or other electronic device. The machine readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

Figure 1:
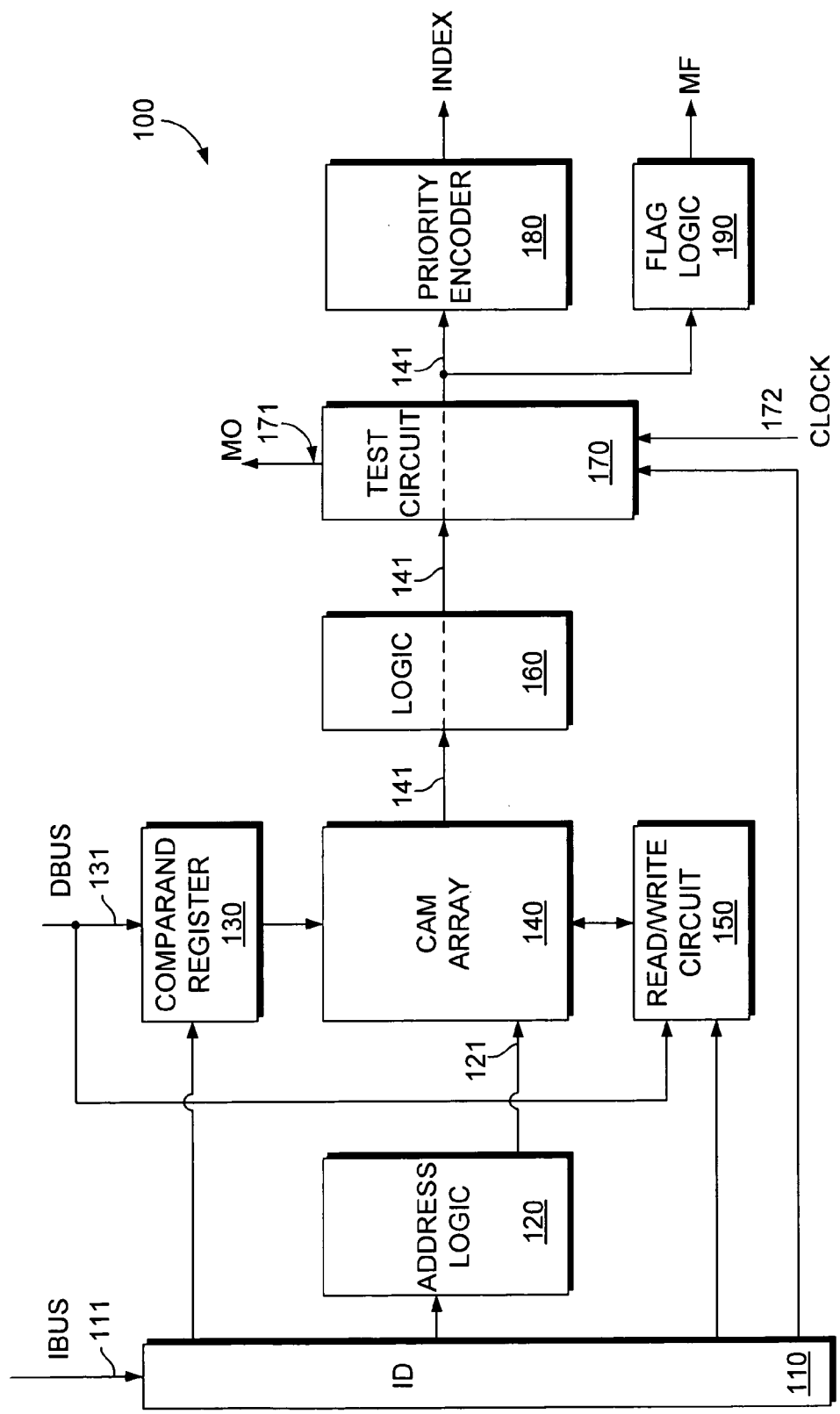
FIG. 1 is a block diagram of a CAM device according to an embodiment of the present invention.

FIG. 1 is a block diagram of a CAM device 100 according to an embodiment of the present invention. CAM device 100 includes instruction decoder 110, address logic 120, comparand register 130, CAM array 140, read/write circuit 150, logic 160, test circuit 170, priority encoder 180, and flag logic 190. CAM device 100 may include other circuit components, such as one or more global mask registers, priority logic, error detection logic, timing generators, and the like which are not shown. The CAM array 140 includes a plurality of rows of CAM cells (not shown) for storing data, and may be segmented into any number of blocks or sub-arrays of CAM cells which may be configurable or combined to support different width and depth configurations. The CAM cells may be any type of CAM cells including binary or ternary CAM cells or other types of CAM cells formed from volatile or non-volatile technologies. For one embodiment, each CAM cell is a ternary CAM cell that has a corresponding mask cell (not shown) in the CAM array 140 that may be used to mask the contents of the CAM cell during a compare operation. Each row of CAM cells, or groups of CAM cells within a row, may also include one or more validity bits that indicate whether data stored in the data words of the CAM cells are valid or invalid (i.e., empty) data.

The instruction decoder 110 receives and decodes instructions from IBUS 111 for the CAM device 100. The instructions may be received from components such as process units (e.g., a network processing unit or "NPU", a microprocessing unit or "MPU" or "CPU", or other controlling devices), or automated test equipment (ATE) such as a memory tester or logic tester. The instruction decoder 110 decodes the received instructions and generates control signals for components in the CAM device 100 to control the execution of the instructions within the device (e.g., write to or read from the CAM array 140, compare, etc.). Note that one or more clock signals may synchronize the supply and execution of the instructions within the CAM device 100.

In response to a write instruction, address logic 120 can access one or more CAM cells in one or more rows of the CAM array 140, and data provided on data bus DBUS 131 may be written to the selected cell(s) by read/write circuit 150. For one embodiment, address logic 120 may include row decoding and/or column decoding circuitry to select one or more word lines 121 and/or bit lines of CAM cells in the CAM array. The address logic 120 may also include an address counter or other counter that provides address values to the row decoding and/or column decoding circuitry. Read/write circuit 150 may include write drivers that are coupled (i.e., connected directly or indirectly through one or more intervening circuits) to one or more bit lines (not shown) in the CAM array 140 so as to provide data over the bit line(s) to the selected cell(s).

The comparand register 130 stores values that may be compared with data stored in the CAM array 140 in response to control signals from the instruction decoder 110. The comparand values in the comparand register 130 are also referred to as search keys. The comparand register 130 is coupled to the DBUS 131 and receives a search key from the DBUS 131. For alternative embodiments, the comparand register may be omitted. In response to a compare instruction, comparand register 130 provides the search key to CAM array 140 (e.g., over one or more comparand signal lines or, alternatively, over one or more of the data bit lines). CAM array 140 compares the search key against its entries and provides the match results on match lines 141.

Logic 160 may be coupled to the match lines 141. For one embodiment, the logic 160 may be a match latch. In this embodiment, the logic operates to store the match results for a period of time before forwarding them down the match lines 141 to other components such as the priority encoder 180. In another embodiment, the logic 160 may be configuration logic. In this embodiment where the CAM array 140 is segmented, the logic 160 may operate to combine multiple match lines in order to generate a correct match result. In still another embodiment, the logic 160 may be, for example, a priority index table that stores priority values for corresponding entries in the CAM array. It should be appreciated that the logic 160 may include other logic or a combination of the described logic and/or other logic.

The flag logic 190 receives the match results on match lines 141 and may generate an indication as to whether there is a match, multiple match, full condition (e.g., from validity bits transmitted over the match lines) or the like. The priority encoder 180 also receives the match results on match lines 141. The priority encoder 180 generates an index or address of the row in the CAM array that stores information (masked or unmasked) that matches the search key and has the highest priority. Priority may be determined between entries in CAM array 140 by the physical location of the entries in the CAM array (i.e., by row number), or by explicit priorities assigned to each entry (e.g., when logic 160 is a priority index table that stores the priorities).

The test circuit 170 receives the match results on match lines 141 and outputs the match results onto match output (MO) 171 in response to a control signal from the instruction decoder 110 or, alternatively, from another device in communication with the CAM device 100, or a scan controller (e.g., a JTAG TAP controller or other BIST controller). The match output 171 may be coupled to a pin, register, or other component. The test circuit 170 includes a plurality of test circuit cells (not shown). Each test circuit cell is coupled to a match line and stores a match result from the match line. According to an embodiment of the CAM device 100, the test circuit 170 may be a register such as a parallel load shift register. In this embodiment, the test circuit 170 receives the match results in parallel from match lines 141. In response to a control signal from instruction decoder 110, the test circuit 170 outputs the match results serially in synchronization with the clock signal provided by clock input 172.

Note that if the CAM array 140 is segmented into individual blocks, banks or sub-arrays, each such block, bank or sub-array can have its own associated test circuit 170 that outputs its results to a separate output of the CAM device or selectively to a common output.

Figure 2:
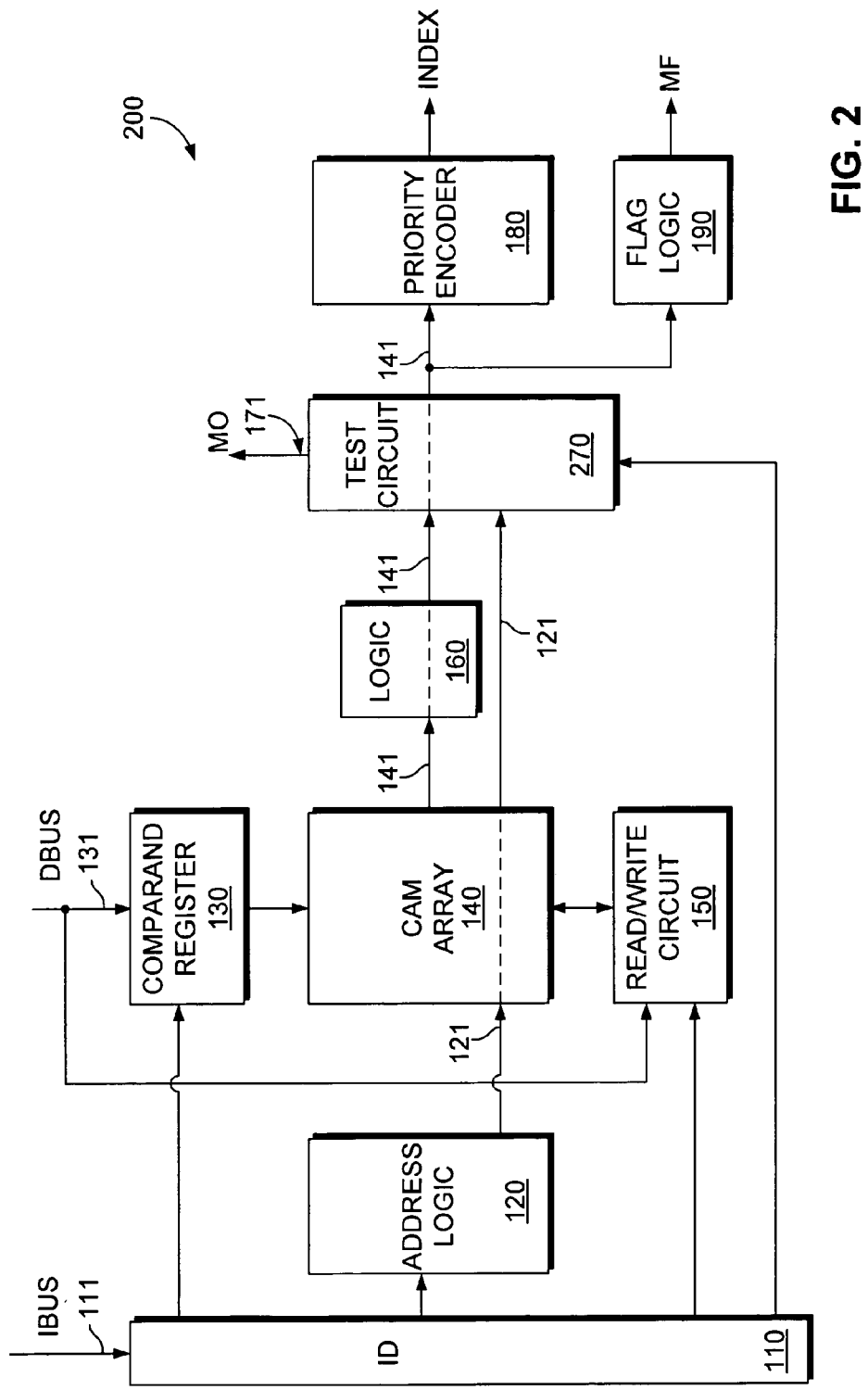
FIG. 2 is a block diagram of a CAM device according to another embodiment of the present invention.

FIG. 2 is a block diagram illustrating a CAM device 200 according to another embodiment of the present invention. The CAM device 200 includes components similar to those in CAM device 100 shown in FIG. 1. The CAM device 200 includes a test circuit 270 that receives the match results on match lines 141. The test circuit 270 outputs onto match output 171 a match result from a specific match line in response to an enable signal from the address logic 120. The match output 171 may be coupled to a pin, register, or other component. The test circuit 270 includes a plurality of test circuit cells (not shown). Each test circuit cell is coupled to a match line and stores a match result from the match line. Each test circuit cell is separately addressable by the enable signal of the address logic 120. For one example, as shown in FIG. 2, each test circuit cell is also coupled to a word line from the CAM array 140 (e.g., one of the word lines 121 collectively shown in FIG. 2), and each such word line may operate to transmit a corresponding enable signal to a specific test circuit cell in the test circuit 270. In response to receiving an enable signal, the test circuit cell outputs a stored match result onto match output 171. For other embodiments, address logic 120 may transmit the enable signals to test circuit 170 over signal lines other than the word lines of CAM array 140.

Figure 3:
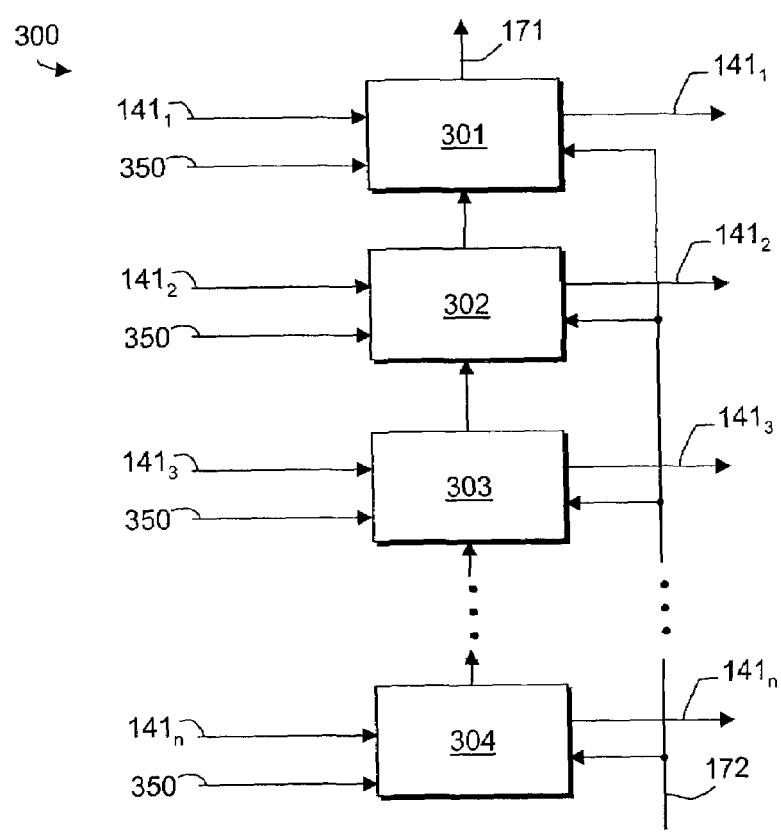
FIG. 3 is a block diagram of the test circuit shown in FIG. 1 according to an embodiment of the present invention.

FIG. 3 is a block diagram of test circuit 300 that is one embodiment of the test circuit 170 shown in FIG. 1. The test circuit 300 includes a plurality of test circuit cells 301–304. Test circuit cell 301 is a first test circuit cell in the test circuit 300. Test circuit cell 302 is a second test circuit cell in the test circuit 300. Test circuit cell 303 is a third test circuit cell in the test circuit 300. Test circuit cell 304 is an nth test circuit cell in the test circuit 300, where n may be the number of match lines 141 (shown in FIG. 1) in the CAM device 100 (shown in FIG. 1).

Each of test circuit cells is coupled to one of the match lines 141 ($141_1$–$141_n$) and stores a match result from one of the match lines 141. Each of the test circuit cells has a cell input and a cell output. The test circuit cells 301–304 are coupled together in series such that the cell input of a test circuit cell is coupled to the cell output of an immediate lower order test circuit cell. In this embodiment, the cell output of the first test circuit cell 301 is coupled to match output 171.

In response to a control signal from the instruction decoder 110 (shown in FIG. 1) on line 350, the match result stored in a test circuit cell is transmitted on its cell output in synchronization with clock input 172. The transmitted match result is stored in the immediate higher order test circuit cell. In the case of the first test circuit cell 301 the match result stored in the first test circuit cell 301 is output onto match output 171.

Figure 4:
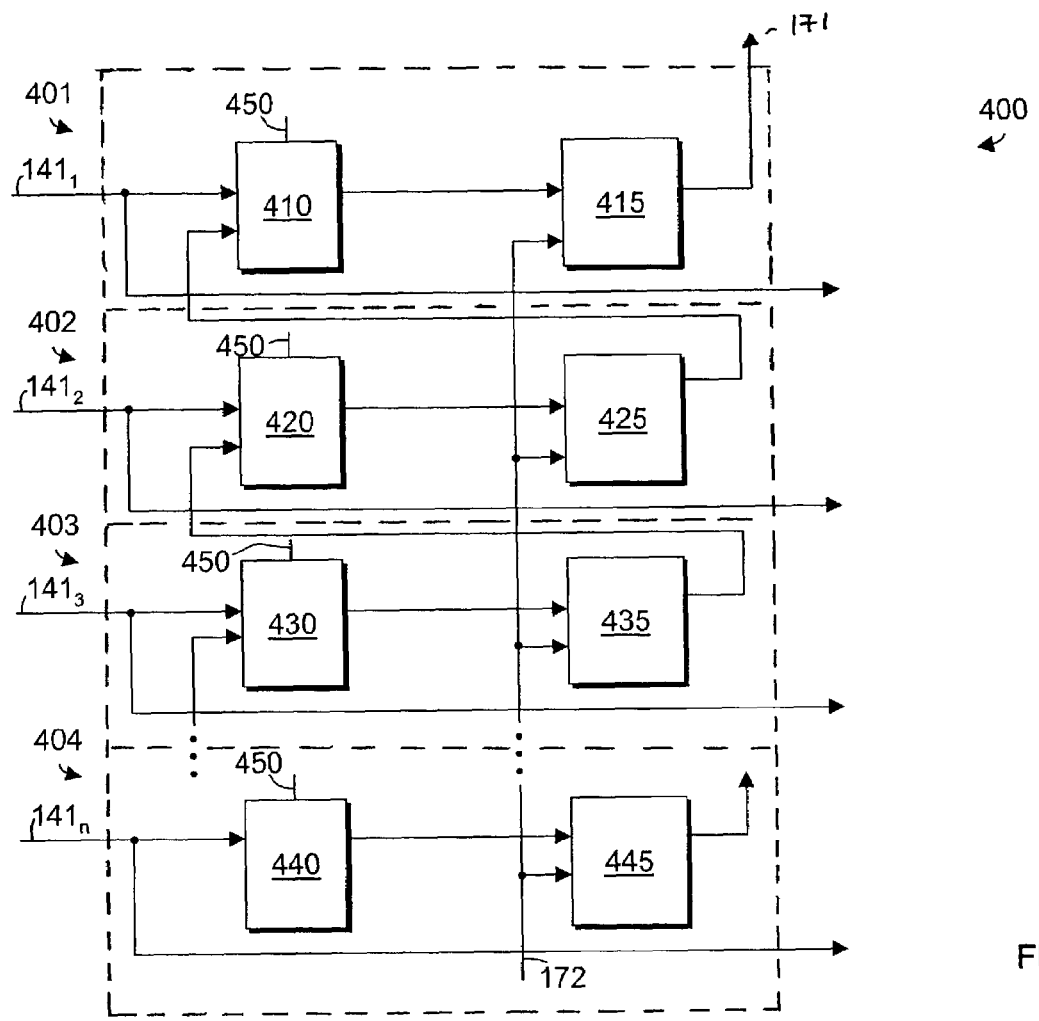
FIG. 4 is a block diagram of an implementation of the test circuit shown in FIG. 3 according to an embodiment of the present invention.

FIG. 4 is a block diagram of test circuit 400 that is one embodiment of test circuit 300 shown in FIG. 3. The test circuit 400 includes a plurality of test circuit cells 401–404. Test circuit cell 401 is a first test circuit cell in the test circuit 400. Test circuit cell 402 is a second test circuit cell in the test circuit 400. Test circuit cell 403 is a third test circuit cell in the test circuit 400. Test circuit cell 404 is an nth test circuit cell in the test circuit 400, where n may be the number of match lines 141 (shown in FIG. 1) in the CAM device 100 (shown in FIG. 1).

Each of the test circuit cells includes a multiplexer and a flip-flop. The first test cell circuit cell 401 includes multiplexer 410 and flip-flop 415. The second test circuit cell 402 includes multiplexer 420 and flip-flop 425. The third test cell circuit cell 403 includes multiplexer 430 and flip-flop 435. The nth test circuit cell 404 includes multiplexer 440 and flip-flop 445. Each of the multiplexers has two inputs. A first input of the multiplexers is coupled to one of the match lines 141. A second input of the multiplexers is coupled to the output of a flip-flop in an immediate lower order test circuit cell such that the test circuit cells 401–404 are coupled together in series. In this embodiment, the second input of the multiplexer in the nth test circuit cell 404 is not coupled to an output of a flip-flop, and the output of the flip-flop in the first test circuit cell 401 is coupled to the match output 171. In response to a control signal on line 450 from the instruction decoder 110 (see FIG. 1), each of the multiplexers selects whether to output a match result from the match line at its first input or a match result stored in a flip-flop from an immediate lower order test circuit cell at its second input.

Each of the flip-flops has an input and an output. Each of the inputs of the flip-flops is coupled to the output of the multiplexer in its test circuit cell. Each flip-flop transmits on its output what it receives at its input in synchronization with clock input 172. According to an embodiment of the test circuit 400, the flip-flops may be D flip-flops.

Figure 5:
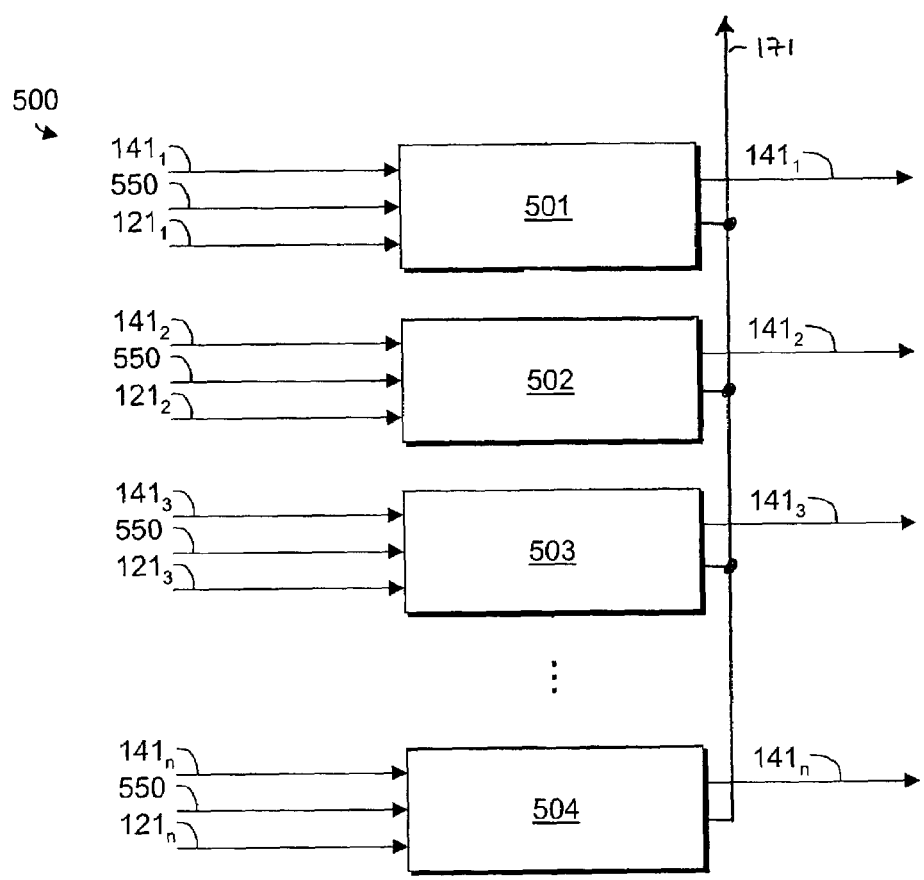
FIG. 5 is a block diagram of the test circuit shown in FIG. 2 according to an embodiment of the present invention.

FIG. 5 is a block diagram of test circuit 500 that is one embodiment of the test circuit 270 shown in FIG. 2. The test circuit 500 includes a plurality of test circuit cells 501–504. Test circuit cell 501 is a first test circuit cell in the test circuit 500. Test circuit cell 502 is a second test circuit cell in the test circuit 500. Test circuit cell 503 is a third test circuit cell in the test circuit 500. Test circuit cell 504 is an nth test circuit cell in the test circuit 300, where n may be the number of match lines 141 (shown in FIG. 2) in the CAM device 200 (shown in FIG. 2).

Each of test circuit cells is coupled to one of the match lines 141 ($141_1$–$141_n$), the instruction decoder 10 (shown in FIG. 2) via line 550, and one of the word lines 121 ($121_1$–$121_n$) from the CAM array 140 (shown in FIG. 2). In response to a control signal from the instruction decoder 110, a test circuit cell latches the match result on its corresponding match line. In response to an enable signal on its corresponding word line, the test circuit cell transmits the latched match result onto match output 171.

Figure 6:
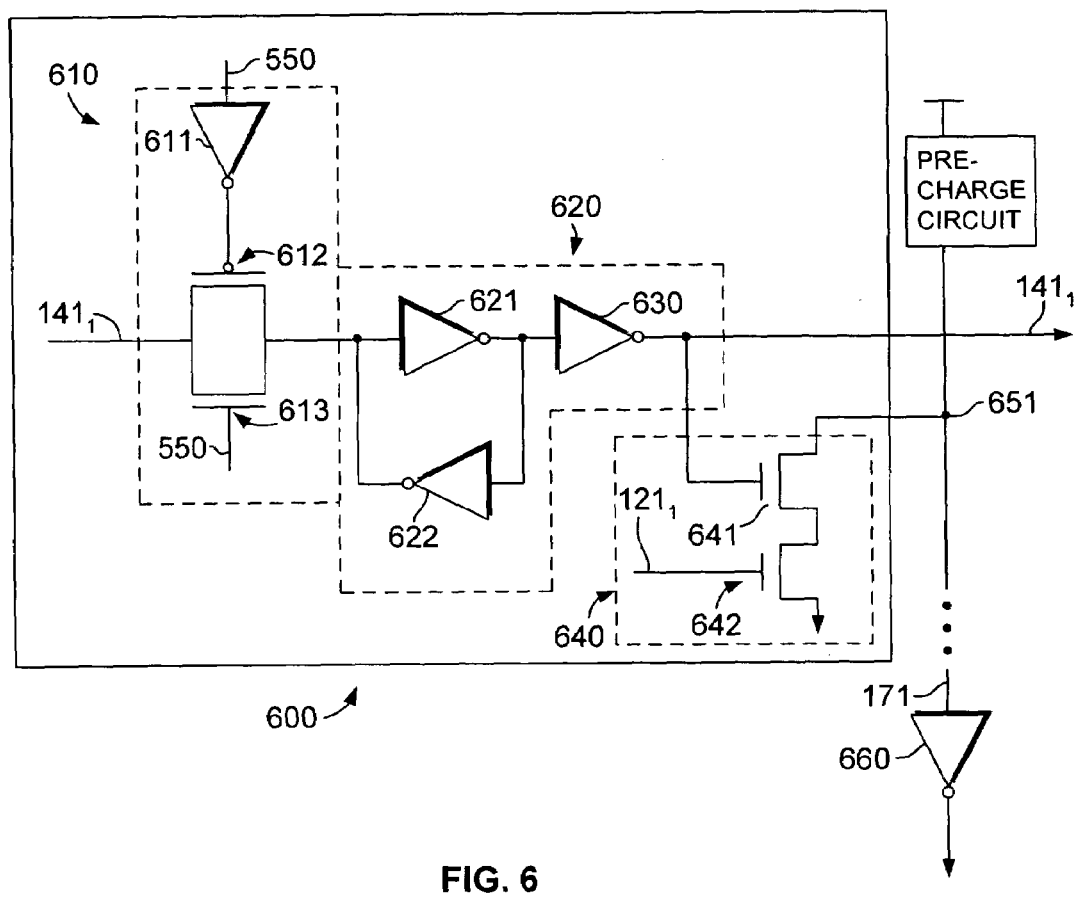
FIG. 6 is a block diagram of an implementation of the test circuit shown in FIG. 5 according to an embodiment of the present invention.

FIG. 6 is a circuit diagram of test circuit cell 600 that is one embodiment of the first test circuit cell 501 in FIG. 5. It should be appreciated that the test circuit 600 may be implemented as any one of the test circuit cells 501–504 shown in FIG. 5. The test circuit cell 600 is coupled to match line $141_1$. The test circuit cell 600 includes a pass gate circuit 610, a latch circuit 620, and a word line enable circuit 640. The pass gate circuit 610 includes an inverter 611, a PMOS transistor 612, and an NMOS transistor 613. The pass gate circuit 610 may be set to a first state which allows a signal representing a match result on match line $141_1$ to be transmitted through, or a second state which does not allow the signal to be transmitted through. The pass gate circuit 610 is set to either the first or second state in response to a control signal on line 550 from the instruction decoder 110 (shown in FIG. 2).

The latch circuit 620 is coupled to the pass gate circuit 610. The latch circuit 620 includes cross-coupled inverters 621 and 622. The cross-coupled inverters 621–622 operate to latch signals transmitted from the pass gate circuit 610. The latch circuit 620 also includes an inverter 630 that restores the logic state of the signal presented at the input to inverter 621.

Figure 7:
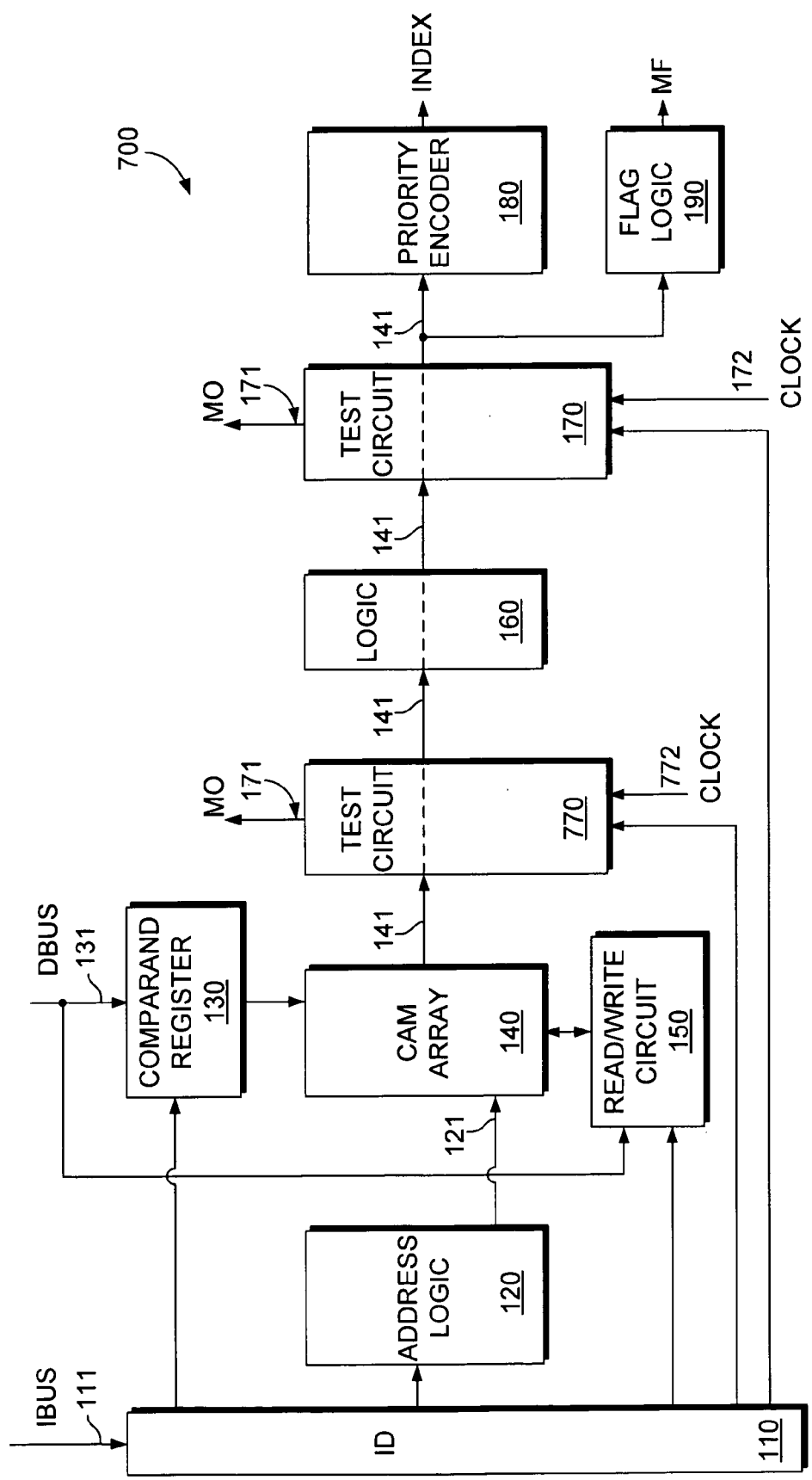
FIG. 7 is a block diagram of a CAM device utilizing a plurality of test circuits according to an embodiment of the present invention.

The word line enabled circuit 640 is coupled to the latch circuit 620 and pre-charged match output 171. The word line enabled circuit 640 includes transistors 641 and 642 connected in series between pre-charged match output 171 and ground potential. When the signal on match line $141_1$ is logic high (e.g., indicating a match condition) and a logic high signal is transmitted to the transistor 642 from word line $121_1$, word line enabled circuit 640 provides a path to ground from node 651. The path to ground discharges the match output 171 to a low state that is logically inverted by inverter 660 such that the match output 171 reflects the high state of match line $141_1$. When the signal on match line $141_1$ is logic low (e.g., indicating a mismatch condition), transistor 641 is in an off state such that word line enabled circuit 640 is unable to discharge match output 171 towards ground. In this state, match output 171 will remain pre-charged towards the power supply rail (and the output of inverter 660 will be logic low) if no other test circuit cell is selected and discharges the match output. Lastly, when word line 121 is logic low such that this test cell is not selected to output its match result to the match output, word line enabled circuit 640 is unable to discharge match output 171 towards ground. In this state, match output 171 will remain pre-charged towards the power supply rail (and the output of inverter 660 will be logic low) if no other test circuit cell is selected and discharges the match output. By allowing access to match results on match lines, the test circuit provides additional versatility to tests that detect faults of components on a CAM device. In order to provide additional support for testing CAM device components, a plurality of test circuits may be implemented on a single CAM device to further isolate potential faults in the CAM device. FIG. 7 is a block diagram of a CAM device utilizing a plurality of test circuits according to another embodiment of the present invention. The CAM device 700 includes test circuit 170 and test circuit 770. Each of the test circuits 770 and 170 may be implemented by test circuit 170 shown in FIG. 1. Match results obtained from test circuit 770 on match output 771 may be used to diagnose the CAM array 140, while match results obtained from test circuit 170 on match output 171 may be used to diagnose logic 160.

Figure 8:
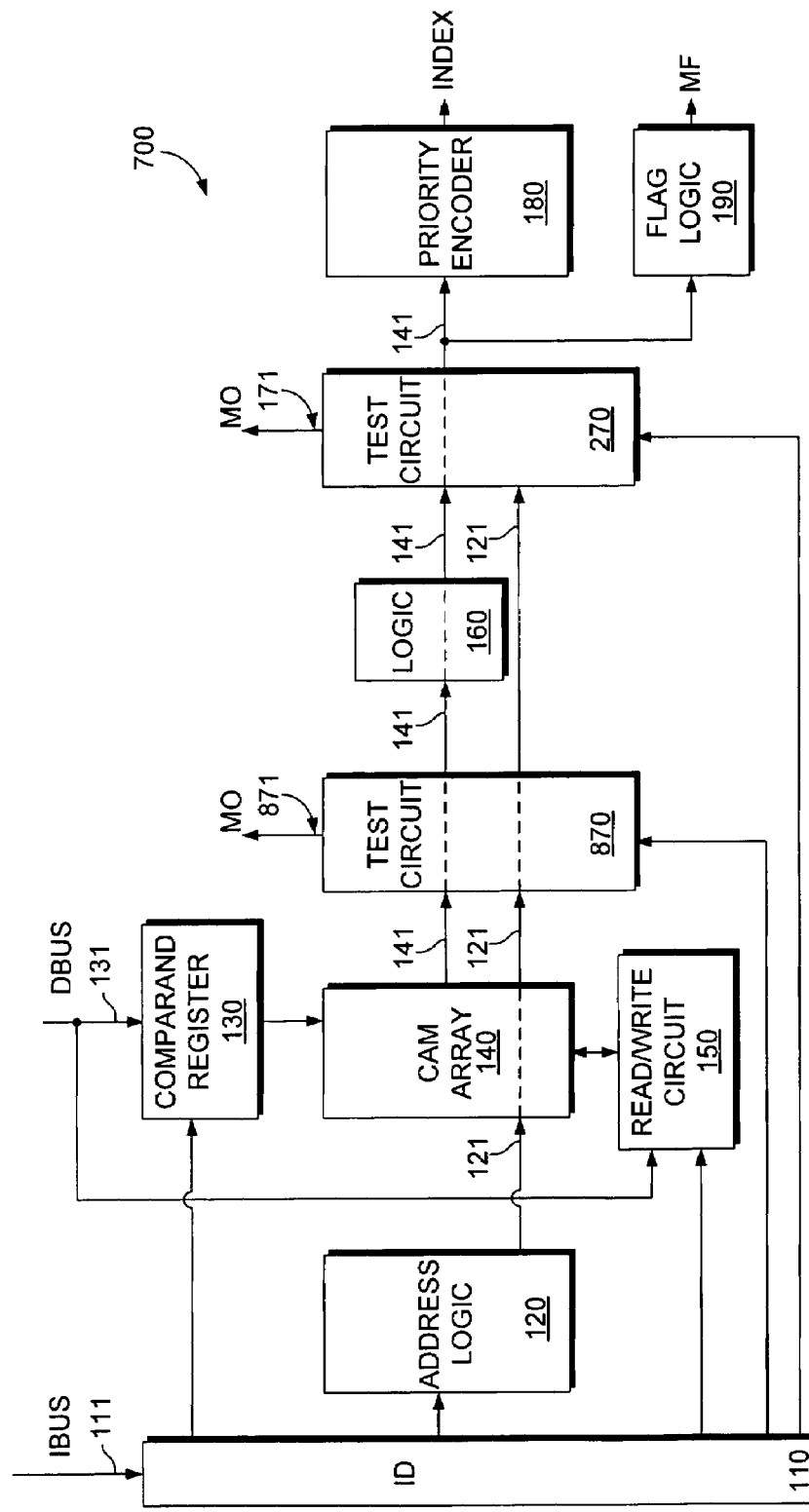
FIG. 8 is a block diagram of a CAM device utilizing a plurality of test circuits according to another embodiment of the present invention.

Similarly, FIG. 8 is a block diagram of a CAM device utilizing a plurality of test circuits according to another embodiment of the present invention. The CAM device 800 includes test circuit 270 and test circuit 870. Each of the test circuits 270 and 870 may be implemented by test circuit 270 shown in FIG. 2. Match results obtained from test circuit 870 on match output 871 may be used to diagnose the CAM array 140, while match results obtained from test circuit 270 on match output 171 may be used to diagnose logic 160.

Referring to FIGS. 1 and 2, although test circuits 170 and 270 are shown to be positioned to the right of logic 160, it should be appreciated that the test circuits 170 and 270 may also be positioned to the left of logic 160. Furthermore, although only two test circuits are shown in FIGS. 7 and 8, it should be appreciated that additional test circuits may be implemented next to additional logic that are coupled to the match lines. The additional test circuits may operate to further isolate potential faults.

It should be appreciated that the instruction decoder 110, address logic 120, comparand register 130, CAM array 140, read/write circuit 150, logic 160, test circuit(s) 170 (270 for FIG. 2, 170 and 770 for FIG. 7, and 270 and 870 for FIG. 8), priority encoder 180, and flag logic 190 may be implemented using any known technique or circuitry. According to an embodiment of the present invention, the instruction decoder 110, address logic 120, comparand register 130, CAM array 140, read/write circuit 150, logic 160, test circuit 170 (270 for FIGS. 2, 170 and 770 for FIG. 7, and 270 and 870 for FIG. 8), priority encoder 180, and flag logic 190 all reside on a single semiconductor substrate. For other embodiments, one or more of the circuits may reside on a separate substrate. Additionally, while particular input and output buses are shown for the CAM devices shown in FIGS. 1–2, and 7–8, the signals on these buses may be time multiplexed over one or more of the other buses. The CAM devices are also shown as asynchronous devices. In alternative embodiments, one or more clock signals may be provided to the CAM devices shown in FIGS. 1–2, and 7–9 and one or more of their circuit components to synchronize operations in the devices.

Figure 9:
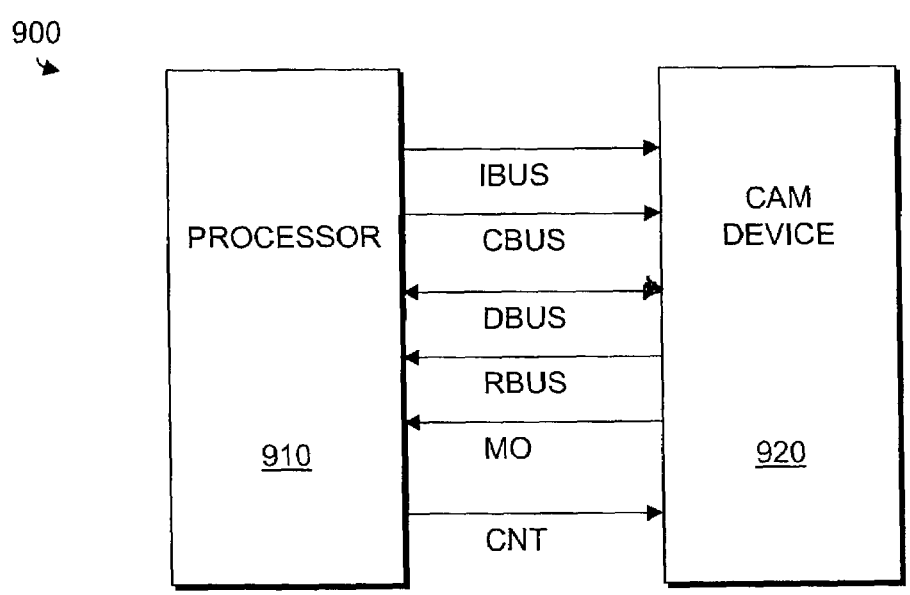
FIG. 9 is a block diagram of a test system for a CAM device under test according to an embodiment of the present invention.

FIG. 9 is a block diagram of a test system 900 for a CAM device under test according to an embodiment of the present invention. The test system 900 includes a tester 910 and a CAM device 920 that is under test. The CAM device 920 may be one of the CAM devices illustrated in FIGS. 1–2, and 7–8. The tester 910 may be implemented by, for example, any type of ATE, network processor, or other test hardware and/or software that communicates with the CAM device 920 and generates instructions for the CAM device 920 as described below with respect to FIGS. 10–13. The tester 910 is coupled to the CAM device 920 via a plurality of signal lines that transmit between the two entities instructions over the IBUS, comparand data over the CBUS, data over the DBUS, compare (e.g., the index from priority encoder) or other results over the RBUS, match results from the test circuit over the match output (MO), and control signals over the CNT.

Note that any of the busses may be combined or shared with one or more of the other busses, for example, by time multiplexing signals over the shared bus(es).

By including the test circuit(s) in architectures shown in FIGS. 1, 2, 7, and 8, the individual match results on individual match lines can be accessed in an efficient manner without extrapolating the individual match results from post-processing by the priority encoder or flag logic. This can further enhance the testability of the CAM architectures so as to, for example, more accurately or more quickly identify failing locations in the CAM array. In one embodiment, the CAM architecture further includes redundant rows (and/or columns) of CAM cells that can then be used to replace the defective rows (and/or columns).

FIGS. 10–13 illustrate exemplary test applications that utilize the test circuits 170 and 270 described above. Note that these examples are just a few of the many useful tests or operations that may be executed in the CAM devices using the test circuits and this disclosure is not so limited to the following illustrations.

Figure 10:
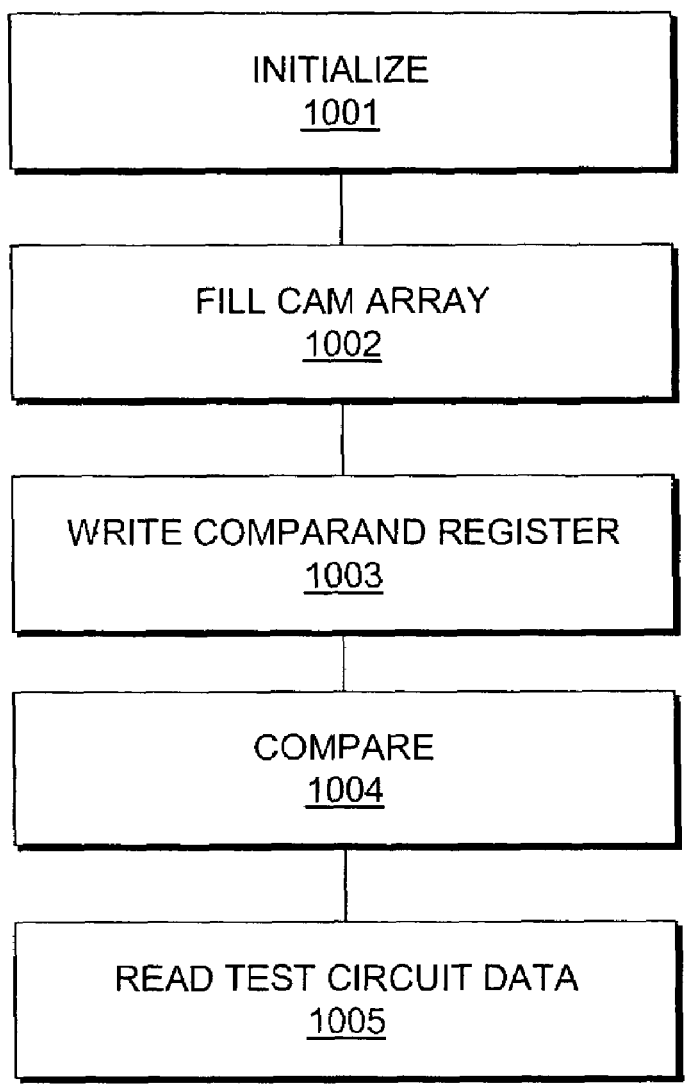
FIG. 10 is a flow chart illustrating a method of operating a CAM device according to an embodiment of the present invention.

FIG. 10 is a flow chart illustrating an example of performing a test sequence to test various circuit components of a CAM device. The test sequence will be described in reference to testing circuit components in the CAM device 100 shown in FIG. 1. It should be appreciated, however, that the test sequence could also be used to test circuit components in the CAM devices shown in FIGS. 2, 7, and 8. In this example, CAM array 140 may be a binary CAM array or a ternary CAM array. The test circuit 170 is used to help test, among other circuits, the compare circuitry in the CAM array 140 and the match lines 141. In this example, all rows of CAM cells in the CAM array 140 are written with data that matches a search key. The data in the rows of CAM cells in the CAM array 140 is then compared with the search key. Since the data written in the rows of CAM cells match the search key, the match lines 141 corresponding to the rows of CAM cells should all generate match results that indicate a match. The match results of the match lines stored in the test circuit 170 are checked to determine whether any row generated a mismatch. If any row did erroneously generate a mismatch result, then the row can be logged for repair, replacement or failure analysis.

At step 1001, CAM device 100 is initialized.

At step 1002, CAM array 140 is filled such that each row of CAM cells in the CAM array 140 is loaded with data (e.g., all logic zeros) that is identical to the search key. If the CAM array 140 is a ternary CAM array, each corresponding local mask is also written with data such that all of the rows are unmasked. According to an embodiment of the present invention, this may be achieved by writing logic zeros into the local mask cells in memory. A fill of the CAM array 140 may be accomplished through a number of instruction sequences provided to instruction decoder 110. For example, each local mask and data word in CAM array 140 may be separately addressed and written to until the array is full. The external testing device or system may provide the addresses, or may use an address counter to increment through the local masks and data words in the CAM array in any order in response to instructions decoded by instruction decoder 110.

At step 1003, a search key is written into the comparand register 130 of the CAM device 100. The search key is identical to the entries stored in the data words of the CAM array 140. According to an embodiment of the present invention, the data also includes values having all logic zeros.

At step 1004, the search key is compared with the data stored in each row of CAM cells in the CAM array 140 and the compare results reflected on match lines 141 as match results. According to an embodiment of the CAM device 100, the match results are transmitted to the test circuit 170.

At step 1005, the match results are read from the test circuit 170. According to an embodiment where the test circuit 170 operates similarly to a parallel load shift register, the match results may be read by having instruction decoder 110 issue a control signal to the test circuit cells of the test circuit 170. In response to the control signal, the test circuit 170 would serially output the match results stored in the storage elements in a sequential manner. According to an embodiment where the test sequence is used to test CAM device 200 (shown in FIG. 2) having test circuit 270 (shown in FIG. 2), address logic 120 (e.g., using an address counter coupled to a decoder) successively accesses individual match results to be output from the test circuit 270 in response to enable signals (e.g., transmitted over word lines). The rows of the CAM device corresponding to the match lines generating mismatched match results may then be logged for repair, replacement or failure analysis.

FIG. 11 illustrates pseudo code describing the operation of the test sequence of FIG. 10 and for generating the instructions for CAM device 100. The pseudo code may be implemented in any software language (e.g., C, C++, etc.) and run on any ATE, processor or other test device or system interfacing with CAM device 100. Each line of code, or a combination of lines of code, represents one or more instructions that are provided to the CAM device to implement the test sequence.

Lines 1101, 1102–1104, 1105, 1106, and 1107–1109 represent steps 1001, 1002, 1003, 1004, and 1005, respectively of FIG. 10. It should be appreciated that if the test sequence was used to test CAM device 200, line 1107 may be substituted to include the following instructions: "RESET ACTR", "LOOP (TABLE DEPTH)", "READ TEST CIRCUIT @ ACTR", and "INCREMENT ACTR", where ACTR refers to an address counter included within the address logic 120. As is evident from the pseudo code of FIG. 11, the addition of test circuit 170 (shown in FIG. 1)/test circuit 270 (shown in FIG. 2) allows the test sequence of FIG. 10 to determine which if any of the match lines in the CAM device is generating an incorrect mismatch. By determining the identity of the match line(s) generating an incorrect mismatch, the entire row associated with the match line may, for example, be replaced with a redundant row in the CAM device.

Note that this example highlights that the architecture of CAM devices 100 and 200 are able to output the match results from individual rows of CAM cells in the CAM array. This can be accomplished without extrapolating this information after processing by the priority encoder or flag logic. For example, if test circuit 170 (or 270) were not included, determining all individual row match results would take a considerably longer amount of time, thus increasing test costs. For example, if there were no defects in the CAM array and all entries matched the search key, then to determine that each entry did indeed match the search key the test sequence would be: compare, read match index and compare against expected result, invalidate matching location, and repeat for all entries. This is considerably more instructions, operations, and time to determine all individual match results. Note that if a row was defective such that it generated a mismatch result, the output match index and expected match index would be different. Also note that if one or more rows were stuck in a match state regardless of whether all data stored within the row matched the search key, the test would be unable to identify further match or mismatch results at lower priority locations in the CAM array due to the stuck-at-match state (i.e., inability to invalidate the match state to a mismatch state) and the operation of the priority encoder. Thus, the inclusion of test circuit 170 (or 270) enables fast, efficient determination of individual row match results.

In another example of the process of FIG. 10, all rows of CAM cells in the CAM array 140 are written with data that mismatches a search key by at least one bit (step 1002). The data in the rows of CAM cells in the CAM array 140 is then compared with the search key (steps 1003 and 1004). Since the data written in the rows of CAM cells mismatch the search key, the match lines 141 corresponding to the rows of CAM cells should all generate match results that indicate mismatches. The match results of the match lines stored in the test circuit 170 are checked to determine whether any row generated an erroneous match result (step 1005). If any row did erroneously generate a match result, then the row can be logged for repair, replacement or failure analysis. Different mismatch data can be loaded into the CAM array and the test repeated (e.g., a single bit mismatch may be consecutively checked across each row or walked across the comparand).

FIG. 12 illustrates pseudo code describing this alternative operation of the test sequence of FIG. 10 and for generating the instructions for CAM device 100. Each line of code, or a combination of lines of code, represents one or more instructions that are provided to the CAM device to implement the test sequence. Lines 1201, 1202–1204, 1205, 1206, and 1207–1209 represent steps 1001, 1002, 1003, 1004, and 1005, respectively of FIG. 10. It should be appreciated that if the test sequence was used to test CAM device 200, lines 1207–1209 may be substituted to include the following instructions: "RESET ACTR", "LOOP (TABLE DEPTH)", "READ TEST CIRCUIT @ ACTR", and "INCREMENT ACTR", where ACTR refers to an address counter included within the address logic 120. As is evident from the pseudo code of FIG. 12, the addition of test circuit 170 (shown in FIG. 1)/test circuit 270 (shown in FIG. 2) allows the test sequence of FIG. 10 to determine which if any of the match lines in the CAM device is generating an incorrect match. By determining the identity of the match line generating an incorrect match, the entire row associated with the match line may, for example, be replaced with a redundant row in the CAM device.

Note that in this example, if test circuit 170 (or 270) were not included, determining all individual row match results would take a considerably longer amount of time, thus increasing test costs. For example, if there were erroneous match results indicated by the index output by the priority encoder and the match flag output by the flag logic, the test sequence would be: compare, determine erroneous result (e.g., read index output by the priority when the match flag indicates a match), invalidate matching location (if possible), and repeat for all erroneous matching entries. This is considerably more instructions, operations, and time to determine all individual match results. Thus, the inclusion of test circuit 170 (or 270) enables fast, efficient determination of individual row match results.

In yet another example of the process of FIG. 10, all rows of CAM cells in the CAM array 140 are written with invalid data (step 1002). This may be accomplished by setting all of the validity bits for the rows of CAM cells to invalid states. For one embodiment, all of the validity bits are set to invalid states in response to the initialization step 1001 (e.g., a reset function) and steps 1001 and 1002 may be combined. The invalid data in the rows of CAM cells in the CAM array 140 is then compared with the search key (steps 1003 and 1004). The search key may be globally masked and/or the local masks of each row of CAM cells (i.e., in a ternary CAM array) may be masked during the compare. Since the rows of CAM cells contain invalid data all of the match lines should indicate mismatches with the search key. The match results of the match lines stored in the test circuit 170 are checked to determine whether any row generated an erroneous match result (step 1005). If any row did erroneously generate a match result, then the row can be logged for repair, replacement or failure analysis.

FIG. 13 illustrates pseudo code describing this alternative operation of the test sequence of FIG. 10 and for generating the instructions for CAM device 100. Each line of code, or a combination of lines of code, represents one or more instructions that are provided to the CAM device to implement the test sequence. Lines 1301, 1302, 1303, 1304 and 1305–1307 represent steps 1001, 1002, 1003, 1004, and 1005, respectively of FIG. 10. It should be appreciated that if the test sequence was used to test CAM device 200, lines 1305–1307 may be substituted to include the following instructions: "RESET ACTR", "LOOP (TABLE DEPTH)", "READ TEST CIRCUIT @ ACTR", and "INCREMENT ACTR", where ACTR refers to an address counter included within the address logic 120. As is evident from the pseudo code of FIG. 13, the addition of test circuit 170 (shown in FIG. 1)/test circuit 270 (shown in FIG. 2) allows the test sequence of FIG. 10 to determine which if any of the match lines in the CAM device is generating an incorrect match. By determining the identity of the match line generating an incorrect match, the entire row associated with the match line may, for example, be replaced with a redundant row in the CAM device.

Note that in this example, if test circuit 170 (or 270) were not included, determining all individual row match results would take a considerably longer amount of time, thus increasing test costs. For example, if there were erroneous match results indicated by the index output by the priority encoder and the match flag output by the flag logic, the test sequence would be: load all entries with at least one bit that is different than a corresponding bit in the search key, invalidate array, compare, determine if erroneous match result (e.g., by monitoring the match flag and the index output by the priority encoder), force matching location to a mismatch state by locally unmasking (in the case of a ternary CAM array) the bit that is different than the corresponding bit in the search key, and repeat for all matching entries. Note that this test may not correctly identify the multiple erroneous matching entries if the first erroneous matching entry is unable to be forced to a mismatch state. This process requires considerably more instructions, operations, and time to determine all individual match results. Thus, the inclusion of test circuit 170 (or 270) enables fast, efficient determination of individual row match results.

FIG. 10 illustrates a flow chart describing methods for testing the CAM devices of FIGS. 1–8 utilizing a test circuit. Some of the illustrated steps may be performed sequentially, in parallel or in an order other than that which is described. It should be appreciated that not all of the steps described are required to be performed, that additional steps may be added, and that some of the illustrated steps may be substituted with other steps.

FIGS. 11–13 illustrate pseudo code for procedures according to embodiments of the present invention. It should be appreciated that some of the lines of code may result in one or more instructions being provided to the CAM device. It should also be appreciated that the pseudo code listed in FIGS. 11–13 are exemplary lines of code and that the procedures may be represented using other instructions.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device, comprising:
   a CAM array that includes a plurality of rows of CAM cells each coupled to a corresponding match line;
   a test circuit to store a row match result received via each of the match lines; and
   address logic coupled to the CAM array to access each of the rows of CAM cells, and coupled to the test circuit to access the individual row match results stored therein.

2. The CAM device of claim 1, wherein the address logic is coupled to the test circuit and the CAM array via word lines.

3. The CAM device of claim 1, wherein the address logic comprises:
   an address counter; and
   a decoder coupled to receive a counter value from the address counter, and configured to output a decode address to the test circuit.

4. The CAM device of claim 1, wherein the test circuit selectively outputs one of the row match results from one of the match lines in response to one of a plurality of enable signals from the address logic.

5. The CAM device of claim 4, wherein the test circuit includes a match output, and wherein the test circuit comprises a plurality of test circuit cells each having a first input coupled to one of the match lines, a second input coupled to receive one of the enable signals, and an output coupled to the match output.

6. The CAM device of claim 5, wherein each of the plurality of test circuit cells outputs the row match result from its associated match line onto the match output in response to an associated enable signal.

7. The CAM device of claim 5, wherein each of the test circuit cells comprises:
   a pass gate circuit;
   a latch circuit coupled to the pass gate circuit; and
   a word line enable circuit coupled to the latch circuit and the match output.

8. A content addressable memory (CAM) device, comprising:
   a CAM array that includes a plurality of rows of CAM cells each coupled to a corresponding match line;
   address logic to assert an enable signal indicated by an address value; and
   a test circuit to store a row match result signaled on a match line that corresponds to the address value and to output the row match result in response to assertion of the enable signal.

9. The CAM device of claim 8, wherein the test circuit comprises a plurality of test circuit cells each coupled to a match line and a word line corresponding to one of the plurality of rows of CAM cells.

10. The CAM device of claim 9, wherein one of the test circuit cells in the test circuit selectively outputs the row match result in response to the enable signal on its associated word line.

11. The CAM device of claim 9, wherein each of the test circuit cells comprises:
    a pass gate circuit;
    a latch circuit coupled to the pass gate circuit; and
    a word line enable circuit coupled to the latch circuit and a match output that provides the row match result.

12. The CAM device of claim 8, further comprising:
a priority encoder coupled to the match lines such that the test circuit is coupled between the CAM array and the priority encoder;
logic coupled to the match lines between the CAM array and the test circuit; and
a second test circuit coupled to the match lines between the CAM array and the logic.

13. A content addressable memory (CAM) device, comprising:
a CAM array that includes a plurality of rows of CAM cells to concurrently generate respective row match results; and
a test circuit that serially outputs each of the row match results onto a first match output.

14. The CAM device of claim 13, wherein the test circuit comprises a parallel load shift register.

15. The CAM device of claim 13, wherein the test circuit comprises a plurality of test circuit cells each coupled to receive a corresponding one of the row match results.

16. The CAM device of claim 15, wherein the plurality of test circuit cells comprises first through nth test circuit cells coupled together in series.

17. The CAM device of claim 16, wherein the first through n–1 test circuit cells includes a cell input coupled to a cell output of a second through the nth test circuit cell respectively, and the first test circuit cell includes a cell output coupled to the match output.

18. The CAM device of claim 16, wherein the first test circuit cell transmits a captured row match result on the match output in synchronization with a clock input in response to a control signal.

19. The CAM device of claim 15, wherein each test circuit cell comprises:
a multiplexer having a first input coupled to receive the corresponding one of the row match results, a second input coupled to receive the row match result corresponding to another row of CAM cells, and an output; and
a flip-flop coupled to the output of the multiplexer.

20. The CAM device of claim 13, wherein each row match result is signaled on a corresponding match line.

21. A content addressable memory (CAM) device, comprising:
a CAM array that includes a plurality of rows of CAM cells each coupled to a corresponding match line;
means for asserting an enable signal indicated by an address value; and
means for storing a row match result signaled on a match line that corresponds to the address value and for outputting the row match result in response to assertion of the enable signal.

22. A test system, comprising:
a test apparatus that generates test signals;
a content addressable memory (CAM) device coupled to the test apparatus to receive the test signals, wherein the CAM device includes:
a CAM array that includes a plurality of rows of CAM cells each coupled to a corresponding match line, and
a test circuit to store row match results received via the match lines and to output the row match results via a match output to enable determination of whether any of the row match results have an incorrect state.

23. A method of operating a content addressable memory (CAM) device, comprising:
capturing row match results concurrently generated by rows of CAM cells in a CAM array; and
serially transmitting the row match results onto a first match output.

24. The method of claim 23, wherein capturing the row match results comprises capturing the row match results in parallel into test circuit cells.

25. The method of claim 23, wherein transmitting the row match results comprises clocking the row match results onto the match output in synchronization with a clock signal.

26. The method of claim 23, wherein each row match result is signaled on a corresponding match line.

27. The method of claim 23, wherein transmitting the row match results occurs in response to a control signal.

28. A method of operating a content addressable memory (CAM) device, comprising:
capturing, in a test circuit, row match results from match lines associated with rows of CAM cells in a CAM array; and
selectively outputting one of the captured row match results from the test circuit in response to an enable signal from an address logic circuit, the enable signal corresponding to a row of CAM cells associated with the one of the captured row match results.

29. The method of claim 28, further comprising transmitting the enable signal over a word line of the CAM array.

* * * * *